United States Patent [19]

Iwatani et al.

[11] 4,309,623
[45] Jan. 5, 1982

[54] POWER SOURCE DEVICE FOR ELECTRONIC COUNTING SYSTEM

[75] Inventors: Katsumi Iwatani; Takeo Ohashi, both of Nagaokakyo, Japan

[73] Assignee: Omron Tateisi Electronics Co., Kyoto, Japan

[21] Appl. No.: 87,863

[22] Filed: Oct. 24, 1979

[30] Foreign Application Priority Data

Nov. 13, 1978 [JP] Japan .................. 53/139499
Nov. 13, 1978 [JP] Japan .................. 53/139501

[51] Int. Cl.³ .................. H03K 3/013; H03K 17/16
[52] U.S. Cl. .................. 307/200 A; 307/238.3; 307/296 R; 361/92
[58] Field of Search .......... 307/200 A, 200 B, 238 B, 307/296; 361/92

[56] References Cited

U.S. PATENT DOCUMENTS

| | | | |
|---|---|---|---|
| 3,751,684 | 8/1973 | Struger | 307/200 A |
| 4,099,068 | 7/1978 | Kobayashi et al. | 307/200 A |
| 4,151,425 | 4/1979 | Cappa | 307/200 A |
| 4,236,087 | 11/1980 | Kaminski et al. | 307/200 A |

Primary Examiner—John S. Heyman
Attorney, Agent, or Firm—Wegner & Bretschneider

[57] ABSTRACT

A power source device for electronic counting systems comprising an a.c. power source, a first d.c. power circuit connected to the a.c. power source for supplying an object detecting device with a d.c. power, a second d.c. power circuit connected to the a.c. power source for supplying a counter with a d.c. power, the rate of discharge of the first d.c. power circuit being less than that of the second d.c. power circuit so as to prevent the counter from receiving signal from the detecting device during power failure of the a.c. power source.

6 Claims, 8 Drawing Figures

POWER SOURCE DEVICE FOR ELECTRONIC COUNTING SYSTEM

BRIEF SUMMARY OF THE INVENTION

The present invention relates to a power source device for electronic counting systems, and more particularly to an improved power source device which is adapted to be immune from the inconvenience caused by failure of the power supply therefor.

The electronic counting system is well known wherein an electronic counting device receives input signals including count pulses from a detecting device such as proximity switch, photo-electric switch, rotary transducer, non-contact relay or the like. Such a detecting device is connected to a power source and supplied with power. If and when the a.c. power source fails to supply the detecting device with power due to an accident or power service interruption, viz. when a power failure occurs, the detecting device is transiently supplied with a lower supply voltage rather than a normal voltage, whereupon the detecting device happens to generate an erroneous signal during the time while the supply voltage is below a predetermined level. Thus, when the erroneous signal generated from the detecting device during power failure is accepted by the electronic counting device as an input signal, the electronic counting device makes counting errors. Such errors are especially fatal to the counting device having a non-volatile memory function which stores the counted data during power failure.

It is, therefore, a primary object of the present invention to provide a power source device for electronic counting systems, wherein during power failure the power source device prevents a counting device from accepting an erroneous signal generated from a detecting device operatively connected to the counting device.

It is a further object of the present invention to provide a power source device having a power failure signal generating means which, before a detecting device generates an erroneous signal during power failure, detects a supply voltage drop and supplies a counting device with a power failure signal which prevents the counting device from accepting the erroneous signal.

It is a still further object of the present invention to provide a power source device having a delay circuit which allows a counting device to accept signals from a detecting device in a predetermined time period after power recovery.

Other objects as well as the numerous advantages of the power source device according to the present invention will become apparent from the following detailed description and accompanying drawings, in which:

DETAILED DESCRIPTION

Figure 1:
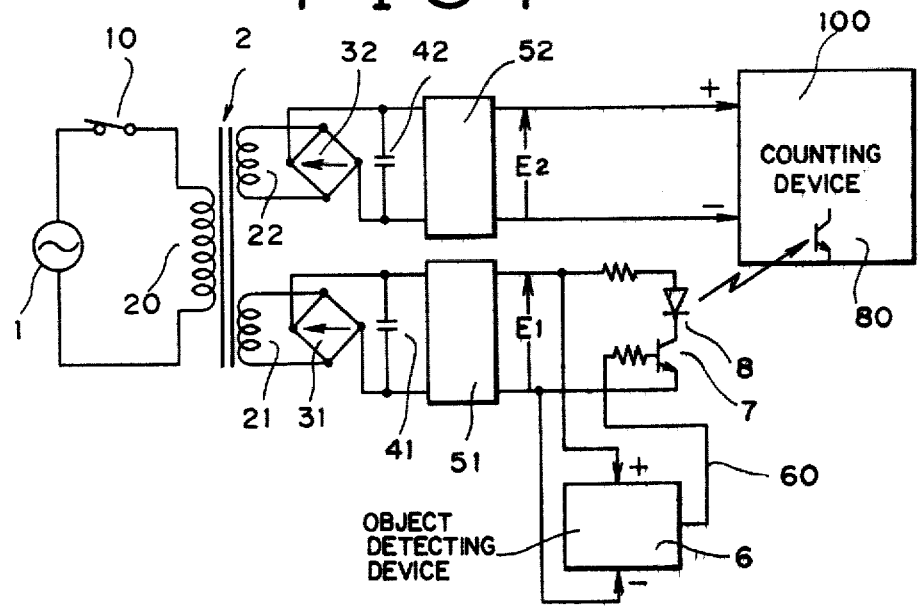
FIG. 1 is a schematic diagram showing a power source device for electronic counting systems as an embodiment of the present invention.
Figure 2:
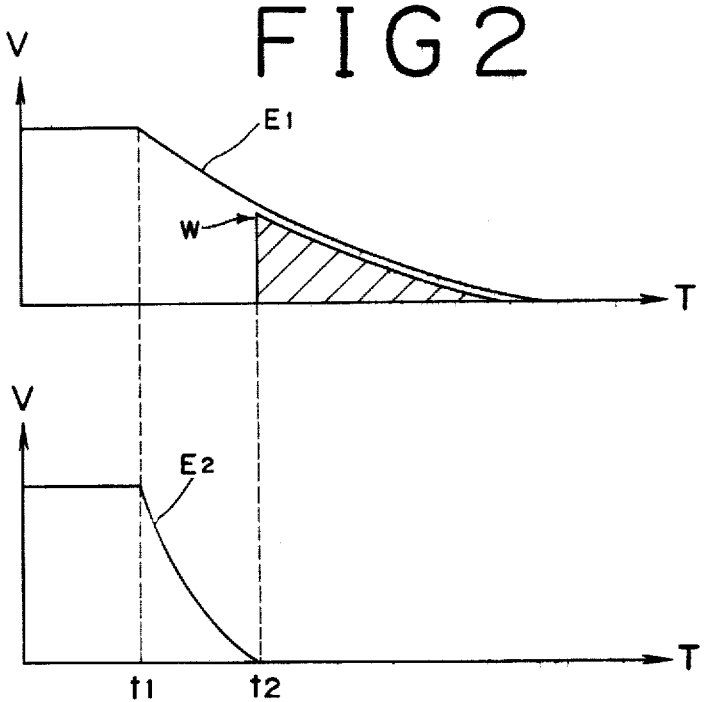
FIG. 2 is a graph showing discharge curves of the supply voltage from the voltage-regulators of the device of FIG. 1.
Figure 7:
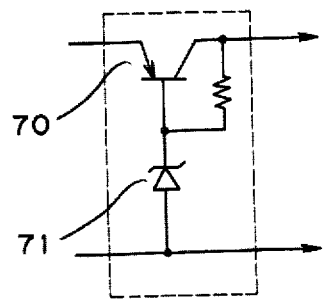
FIGS. 7 and 8 show circuit diagrams of voltage regulators which may be employed in the device of FIG. 1, 3 or 5.
Figure 8:
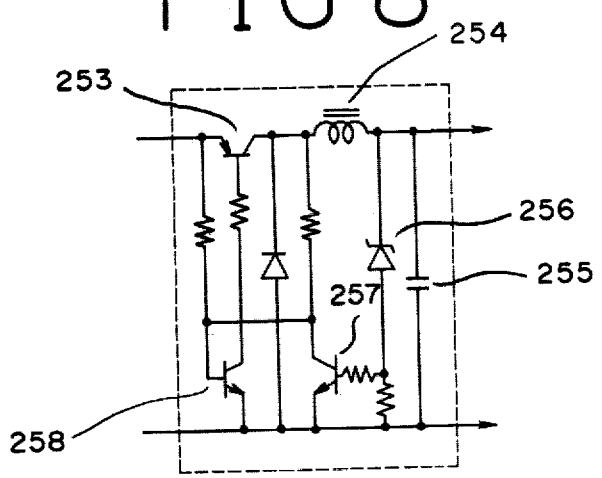

Referring, now, to FIG. 1, a power source device according to one embodiment of the present invention is connected to an electronic counting device 100 and to an object detecting device 6 which supplies the counting device 100 with an input signal. The power source device comprises an a.c. power source 1, a transformer 2 having the secondary windings 21 and 22, a first d.c. power circuit connected to the secondary winding 21 and the counting device 6, and a second d.c. power circuit connected to the secondary winding 22 and the counting device 100. The primary winding 20 is connected through a power switch 10 to the a.c. power source 1. The first d.c. power circuit consists of a rectifier 31 connected to the secondary winding 21, a smoothing capacitor 41, and a voltage-regulator circuit 51. The second d.c. power circuit consists of a rectifier 32 connected to the secondary winding 22, a smoothing capacitor 42, and a voltage-regulator circuit 52. The voltage-regulator circuits 51 and 52 may employ a conventional circuit as shown in FIG. 7 or a switching type voltage-regulator circuit as shown in FIG. 8. FIG. 2 shows discharge curves $E_1$ and $E_2$ of supply voltage from the voltage-control circuits 51 and 52, respectively. The first and second d.c. power circuits having capacitors 41 and 42 are designed so that the supply voltage $E_1$ from the circuit 51 may have a smaller rate of discharge than the supply voltage $E_2$ from the circuit 52 when a power failure occurs in the a.c. power source 1, as shown in FIG. 2.

The circuit 52 supplies the electronic counting device 100 with the supply voltage $E_2$, and the circuit 51 supplies the object detecting device 6 with supply voltage $E_1$. The power $E_1$ is further supplied to a light emitting diode 8 and a transistor 7 driven by the output signal generated from the device 6. The diode 8 forms a photo-coupler with a photo-electric transistor 80 which is built into the counting device 100. Thus, the output signal from the device 6 is normally entered through the photo-coupler into the counting device 100 as an input signal.

Referring to FIG. 2, when a power failure of the source, occurs at a time-point $t_1$, the supply voltage $E_1$ to the device 6 starts to drop along the curve $E_1$. As the voltage $E_1$ is reduced below a level at a time-point $t_2$, the detecting device 6 generates an erroneous signal W. The second d.c. power circuit is designed so that at the time-point $t_2$ the supply voltage $E_2$ is almost zero wherein the counting device 100 is inoperable. Accordingly, even if, after the time-point $t_2$, the improper signal W is applied to the device 100 from the device 6, the counting device 100 will not accept the signal W.

According to this embodiment, the output signal from the device 6 is supplied through the photo-coupler (8 and 80) to the device 100, the first and second d.c. power circuits for generating the supply voltage $E_1$ and $E_2$, respectively, are completely electrically separated, so that the counting device 100 is free from electrical noises and is improved with respect to signal-to-noise ratio. Though in FIG. 1 there is shown only one photocoupler, the output signal from the device 6 may include a count pulse signal, a gate control signal, a reset signal and other signal, and a plurality of photo-couplers may be incorporated between the devices 6 and 100.

Figure 3:
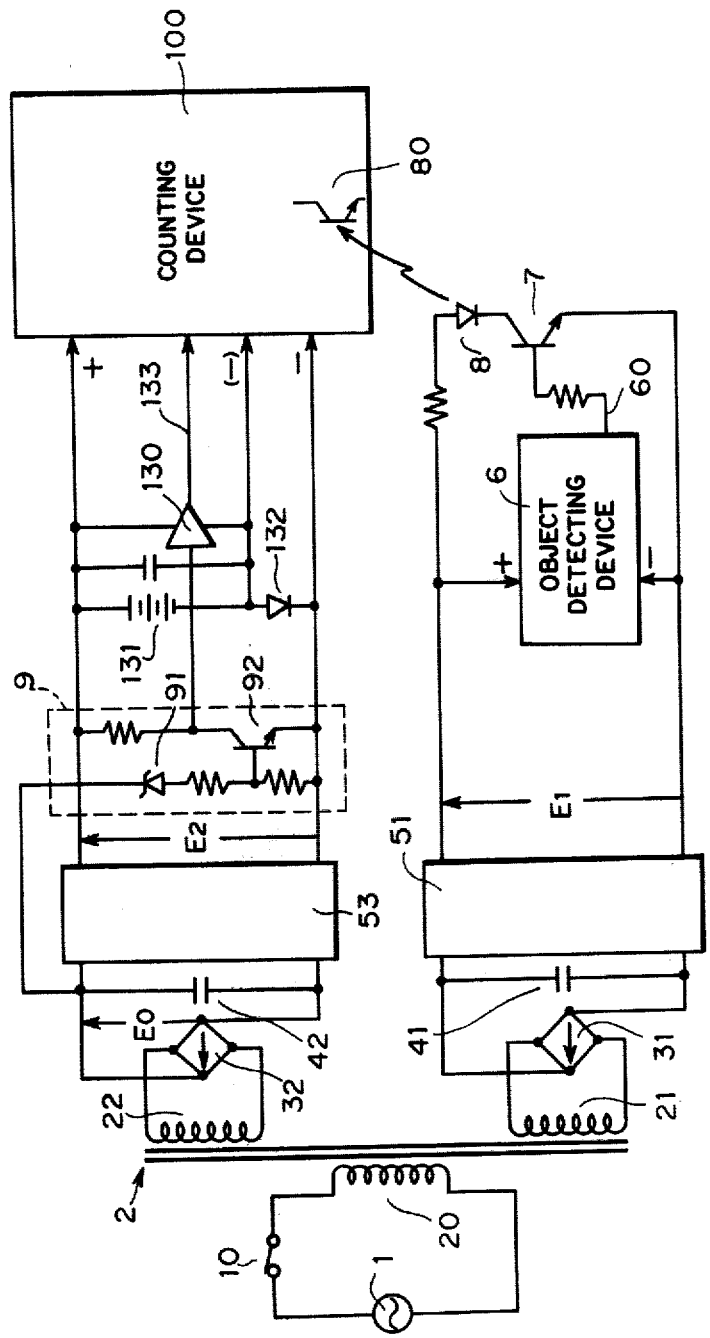
FIG. 3 is a schematic diagram of a power source device of another embodiment according to the present invention.

FIG. 3 shows a circuit diagram of the power source device of another embodiment of the present invention which is connected to a counting device 100 and a detecting device 6. The counting device 100 in this embodiment is adapted to be capable of having a non-volatile memory function during power failure. The other same reference numerals used in FIG. 3 as those of FIG. 1 represent the same parts of FIG. 1. A first d.c. power circuit which consists of a rectifier 31, a capacitor 41, a voltage-regulator circuit 51 supplies the device 6 with a d.c. power. A second d.c. power circuit being connected to the secondary winding 22 mainly comprises rectifier 32, capacitor 42, voltage-regulator circuit 53, voltage detector circuit 9, and supplemental d.c. power source 131, e.g. a battery. The counting device 100 is supplied with the supply voltage $E_2$ from the circuit 53.

The circuit 53 is a switching type voltage-regulator circuit in which without large power loss there can be a large difference between the non-stable input voltage $E_0$ and the stable output voltage $E_2$. The circuit 53 is shown in detail in FIG. 8, which comprises a switching portion having a transistor 253, a smoothing portion having a coil 254 and a capacitor 255, and a control portion having a zener diode 256 and transistors 257 and 258.

The voltage detector circuit 9 is adapted to detect a predetermined level $E_s$ which is approximately intermediate between the input voltage $E_0$ and the output voltage $E_2$ of the voltage-regulator circuit 53 in normal situations. The circuit 9 substantially consists of a zener diode 91 and a transistor 92, and generates a power failure signal when the input voltage $E_0$ drops below the predetermined level $E_s$. The generated power failure signal from the circuit 9 is applied through a buffer circuit 130 to the counting device 100. The battery 131 supplies the buffer circuit 130 and the counting device 100 with a d.c. power as a supplemental power source so that the counting device 100 stores the data entered therein even during power failure. The diode 132 prevents the battery 131 from discharging a current to other unnecessary parts. The power failure signal generated from the detector circuit 9 inhibits the counting device 100 from accepting signals from the detecting device 6 and instructs the device 100 to store the data entered therein during power failure.

Figure 4:
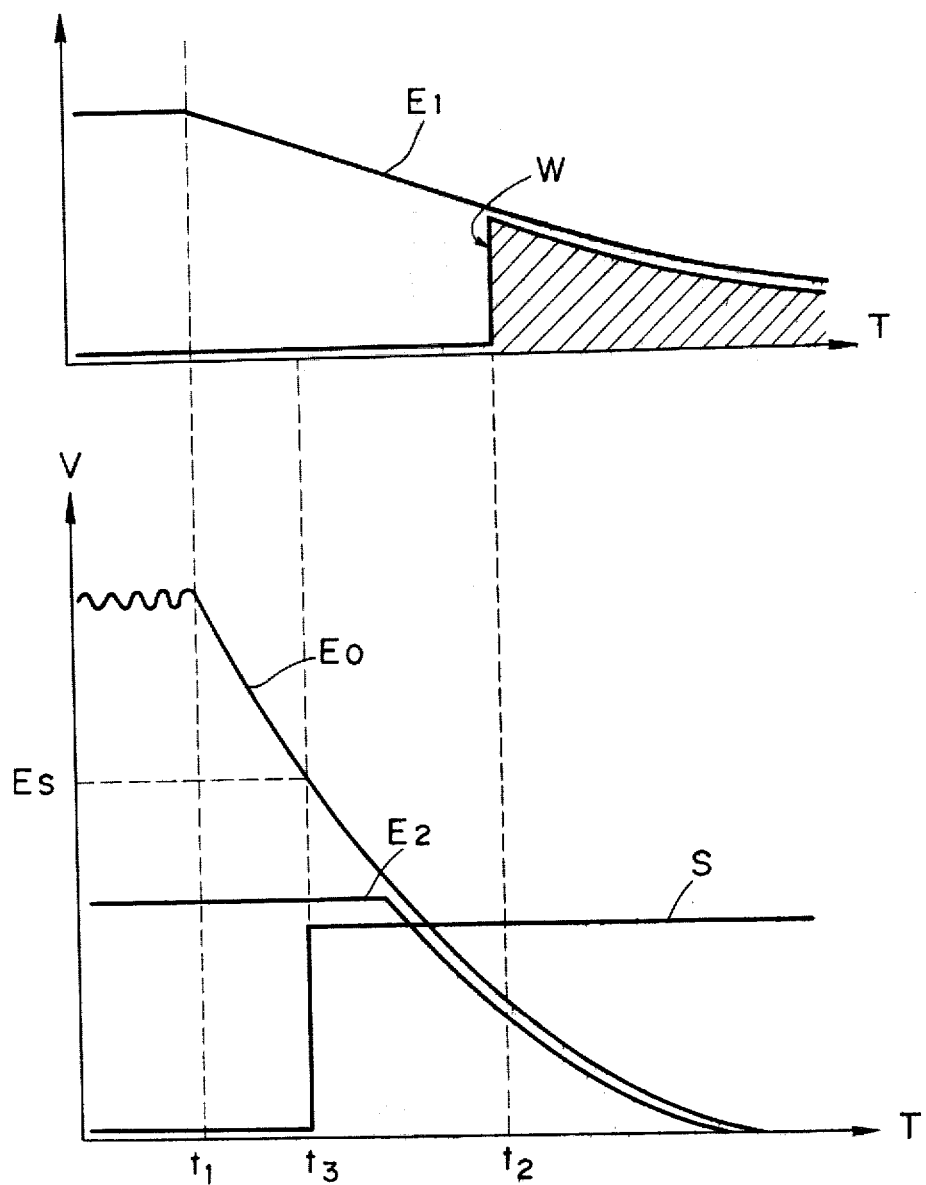
FIG. 4 is a diagram illustrating the discharging operation of the device of FIG. 3.

FIG. 4 shows the discharge curves in the device of FIG. 3 when a power failure occurs in the a.c. power source 1. When the power failure occurs at a time-point $t_1$, the input voltage $E_0$ in a ripple wave till the point $t_1$ drops in accordance with a predetermined time constant after the time-point $t_1$. Before the output voltage $E_2$ begins to drop away from the regulation range of the voltage-regulator circuit 53, the input voltage $E_0$ is reduced below the predetermined level $E_s$ and the power failure signal S is generated from the detector circuit 9 at a time-point $t_3$. The time-point $t_3$ where the power failure signal is generated is prior to a time-point $t_2$ where, as the output voltage $E_1$ from the voltage-regulator circuit 51 drops, an erroneous output signal W (shown in oblique lines) is generated. Accordingly, at the time-point $t_2$ when the erroneous output signal W appears, the counting device 100 will not receive the signal W from the detecting device 6, and will not make errors. To make certain the operation of the counting device 100 during power failure, it is expected that the rate of discharge of the output voltage $E_1$ from the circuit 51 is sufficiently less than the rate of discharge of the input voltage $E_0$ to the circuit 53 so that the time-point $t_3$ is absolutely prior to the time-point $t_2$.

Figure 5:
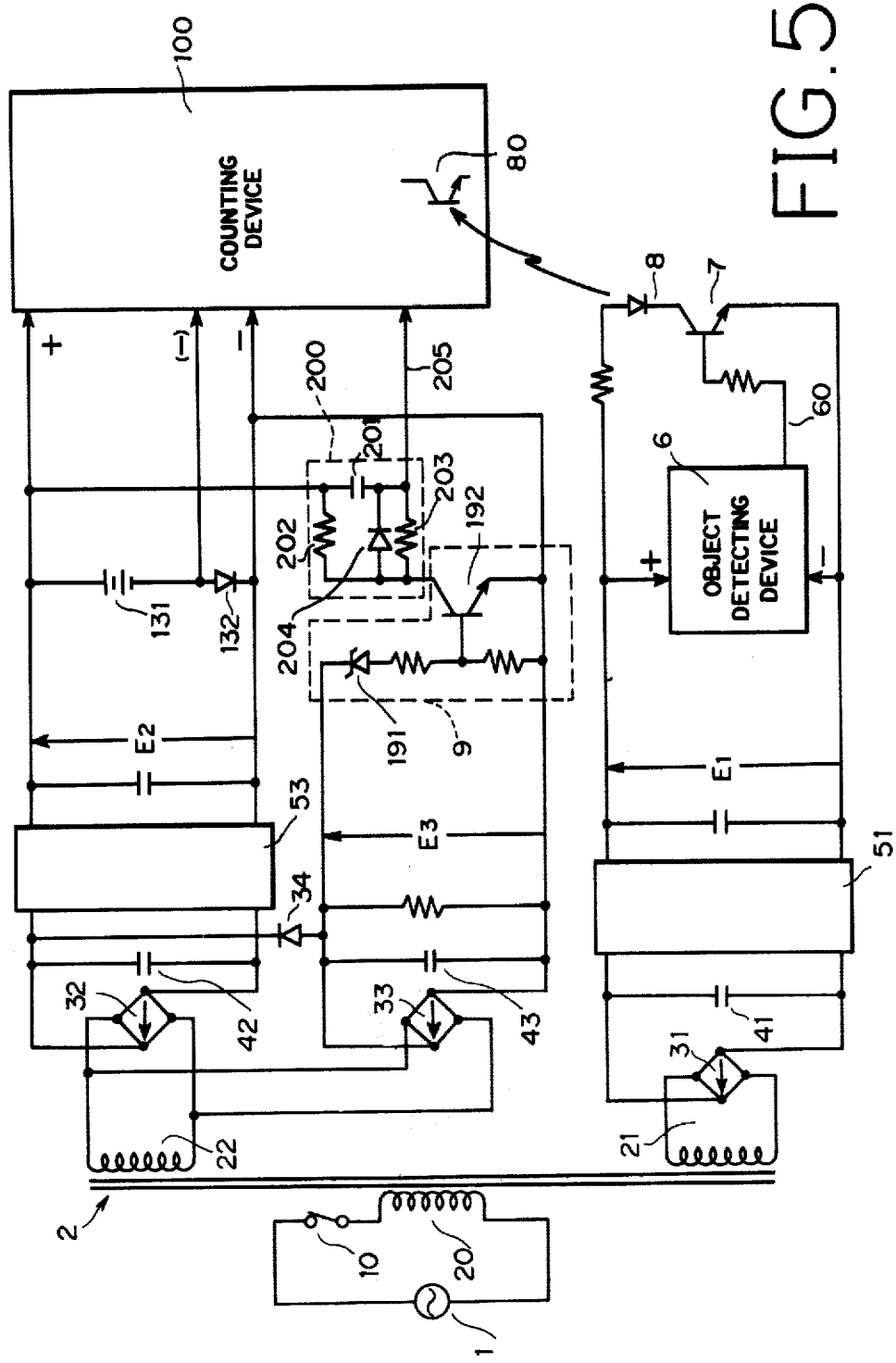
FIG. 5 is a schematic diagram of a power source device of another embodiment according to the present invention.
Figure 6:
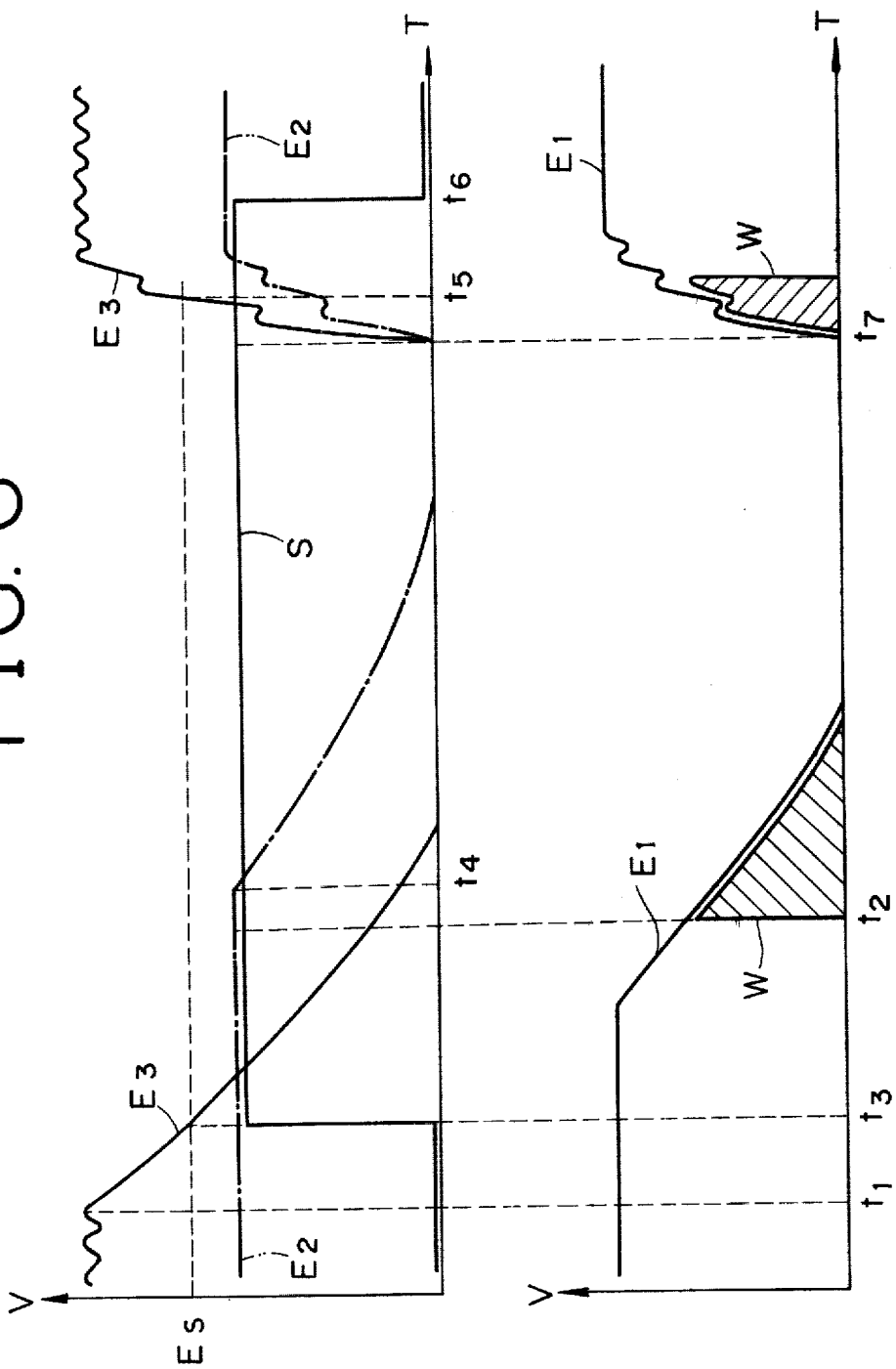
FIG. 6 is a diagram illustrating the discharging operation of the device depicted in FIG. 5.

FIG. 5 shows a circuit diagram of the power source device according to another embodiment of the present invention, wherein a second d.c. power circuit connected to counting device 100 comprises first and second rectifying circuits 32 and 33. The circuit 32 is for supplying the counting device 100 with a d.c. power, and the circuit 33 is for supplying the voltage detector circuit 9 with a supply potential to be detected thereby. Voltage-regulator circuit 53 for supplying the counting device 100 with main d.c. power and the voltage detector circuit 9 are independently connected to the rectifiers 32 and 33, respectively. In FIG. 6, there are shown discharge and charge curves of d.c. supply voltage in the power source device of FIG. 5. When power failure of a.c. power source 1 occurs at a time-point $t_1$, the supply voltage $E_3$ generated from the rectifying-smoothing circuit consisting of the rectifier 33 and smoothing capacitor 43 starts to drop. When and after the voltage $E_3$ drops below a predetermined level $E_s$, a power failure signal S is generated from the voltage detector circuit 9. The signal S is applied through a delay circuit 200 to the counting device 100 so as to prevent the device 100 from accepting any output signal from the object detecting device 6. The delay circuit 200 is designed to have only a negligible time delay at the time-point $t_3$. In parallel with the drop of the voltage $E_3$, the input voltage of the voltage-regulator circuit 53 drops, while the output voltage $E_2$ begins to drop at a time-point $t_4$ as shown in FIG. 6. The time-point $t_4$ will occur earlier if the circuit 53 is connected to a larger power consumption counting device 100. Namely, the input power impedance of the counting device 100 affects the timing when the time-point $t_4$ occurs, but does not affect the timing of the time-point $t_3$ since the voltages $E_2$ and $E_3$ are independently generated from separate rectifiers 32 and 33. The discharge time duration of $E_3$ is defined so that the time-point $t_3$ is sufficiently prior to a time-point $t_2$ when an erroneous signal W is generated from the detecting device 6 during power failure. In the present embodiment, the adjustment of the discharge time duration of the second d.c. power circuit connected to the counting device 100 is represented by the adjustment of the discharge time duration of the supply voltage $E_3$.

When power from the a.c. power source 1 is recovered at a time-point $t_7$, each of voltages $E_1$, $E_2$ and $E_3$ rises as shown in FIG. 6. After the voltage $E_3$ at a time-point $t_5$ reaches the predetermined level $E_s$, the voltage detector circuit 9 at a time-point $t_6$ ceases to generate the power failure signal S. The time delay between $t_5$ and $t_6$ is defined by time constant of the delay circuit 200. In this embodiment the resistance value of resistor 203 is defined to be one hundred times the value of resistor 202. The time-point $t_6$ is defined so that it is sufficiently after the time-point when the erroneous signal W is not generated from the detecting device 6 after power recovery.

A diode 34 is connected across the positive lines of the rectifiers 32 and 33. When the input voltage of the circuit 53 is reduced below the voltage $E_3$, the diode 34 forces the voltage $E_3$ to be close to the input voltage of the circuit 53, whereby the power failure signal S is safely generated even if the output voltage $E_2$ drops rapidly due to the large power consumption of the counting device 100.

According to the present embodiment, the second rectifying-smoothing circuit for supply voltage to be detected by the detector circuit 9 is independent from the first rectifying-smoothing circuit for d.c. main power supply to the counting device 100, so that the power failure signal is precisely generated and erased without being affected by the magnitude of the power consumption of the counting device 100.

In the foregoing embodiments, the transformer 2 has two secondary windings, but alternatively may have one common secondary winding or a plurality of secondary windings each being connected to a rectifying-smoothing circuit.

It should be understood that the above description is merely illustrative of the present invention and that many changes and modifications may be made by those skilled in the art without departing from the scope of the appended claims.

What is claimed:

1. A power source device comprising
   a a.c. power supplying means,
   a first d.c. power circuit means having a first predetermined rate of power discharge connected to said a.c. power supplying means for supplying an object detecting device with a d.c. power,
   a second d.c. power circuit means having a second predetermined rate of power discharge connected to said a.c. power supplying means for supplying an electronic counting device with a d.c. power,
   said detecting device being adapted to supply said electronic counting device with input trigger pulses thereto,
   said first d.c. power circuit means having a rate of discharge less than that of said second d.c. power circuit means,
   so that the voltage of said second d.c. power circuit means during a failure of said a.c. power supplying means will be decreased to such a level that said counting device will not accept an input signal for counting if said detecting device generates an erroneous pulse during said a.c. power supplying means failure.

2. A power source device according to claim 1, wherein said second d.c. power circuit means includes a power failure signal generating means for supplying said electronic counting device with a power failure signal as the d.c. supply voltage in said second d.c. power circuit means drops below a predetermined level, said power failure signal preventing said electronic counting device from accepting said erroneous signal generated from said detecting device, and a supplemental d.c. power source which is connected to said power failure signal generating means and said electronic counting device.

3. A power source device according to claim 2, wherein said second d.c. power circuit means includes a rectifying-smoothing circuit connected to said a.c. power supplying means and a switching type voltage-regulator circuit connected to said rectifying-smoothing circuit, said power failure signal generating means detecting an output voltage from said rectifying-smoothing circuit, and said voltage-regulator circuit supplying said electronic counting device with a d.c. power.

4. A power source device according to claim 2, wherein said second d.c. power circuit means includes a first rectifying-smoothing circuit for supplying said electronic counting device with a d.c. power and a second rectifying-smoothing circuit for supplying said power failure signal generating means with a d.c. potential in proportion to a supply voltage from said a.c. power supplying means, the time duration of discharge of said second rectifying-smoothing circuit representing said time duration of discharge of said second d.c. power circuit means.

5. A power source device according to claim 4 further comprising a diode connected across the positive lines of said first and second rectifying-smoothing circuits so that the potential of said second rectifying-smoothing circuit is urged to be close to the potential of said first rectifying-smoothing circuit by said diode.

6. A power source device according to claim 2 further comprising a delay circuit between said power failure signal generating means and electronic counting device, so that the power failure signal from said power failure signal generating means is applied to said electronic counting device in a predetermined time duration after a power recovery of said a.c. power supplying means.

* * * * *